United States Patent
Syed et al.

(10) Patent No.: US 11,251,370 B1
(45) Date of Patent: Feb. 15, 2022

(54) PROJECTED MEMORY DEVICE WITH CARBON-BASED PROJECTION COMPONENT

(71) Applicant: INTERNATIONAL BUSINESS MACHINES CORPORATION, Armonk, NY (US)

(72) Inventors: Ghazi Sarwat Syed, Zurich (CH); Vara Sudananda Prasad Jonnalagadda, Wallisellen (CH); Benedikt Kersting, Zurich (CH); Manuel Le Gallo-Bourdeau, Zurich (CH); Abu Sebastian, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/991,116

(22) Filed: Aug. 12, 2020

(51) Int. Cl.
*H01L 45/00* (2006.01)
*G11C 13/00* (2006.01)
*G06N 3/08* (2006.01)

(52) U.S. Cl.
CPC .............. *H01L 45/06* (2013.01); *G06N 3/08* (2013.01); *G11C 13/0004* (2013.01);
(Continued)

(58) Field of Classification Search
CPC ... H01L 45/06; H01L 45/1625; H01L 45/146; H01L 45/144; H01L 45/148;
(Continued)

(56) References Cited

U.S. PATENT DOCUMENTS 7,932,101 B2  4/2011  Lung
8,309,407 B2  11/2012  Schricker
(Continued)

FOREIGN PATENT DOCUMENTS

CN  101197423 B  4/2010
CN  101604729 B  7/2011
(Continued)

OTHER PUBLICATIONS

Dong, et al., "The Impact of RTN Signal on Array Level Resistance Fluctuation of Resistive Random Access Memory," IEEE Electron Device Letters, vol. 39, No. 5, doi: 10.1109/LED.2018.2821681, https://ieeexplore.ieee.org/abstract/document/8329230, May 2018, pp. 676-679.

(Continued)

*Primary Examiner* — Tan T. Nguyen
(74) *Attorney, Agent, or Firm* — John Noh (57) ABSTRACT

A projected memory device includes a carbon-based projection component. The device includes two electrodes, a memory segment, and a projection component. The projection component and the memory segment form a dual element that connects the two electrodes. The projection component extends parallel to and in contact with the memory segment. The memory segment includes a resistive memory material, while the projection component includes a thin film of non-insulating material that essentially comprises carbon. In a particular implementation, the non-insulating material and the projection component essentially comprises amorphous carbon. Using carbon and, in particular, amorphous carbon, as a main component of the projection component, allows unprecedented flexibility to be achieved when tuning the electrical resistance of the projection component.

25 Claims, 9 Drawing Sheets

(52) U.S. Cl.
CPC ........ *G11C 13/004* (2013.01); *G11C 13/0069* (2013.01); *G11C 13/0097* (2013.01); *H01L 45/1226* (2013.01); *H01L 45/142* (2013.01); *H01L 45/143* (2013.01); *H01L 45/144* (2013.01); *H01L 45/146* (2013.01); *H01L 45/148* (2013.01); *H01L 45/1616* (2013.01); *H01L 45/1625* (2013.01); *H01L 45/1641* (2013.01); *G11C 2013/0052* (2013.01); *G11C 2013/0092* (2013.01)

(58) Field of Classification Search
CPC ............ H01L 45/1226; H01L 45/142; H01L 45/1641; H01L 45/1616; H01L 45/143; G11C 13/004; G11C 13/0097; G11C 13/0069; G11C 13/0004; G11C 2013/0052; G11C 2013/0092; G06N 3/08
USPC ......................................... 365/163, 148, 158
See application file for complete search history.

(56) References Cited

U.S. PATENT DOCUMENTS

| | | | |
|---|---|---|---|
| 9,640,759 B1 * | 5/2017 | Curioni | ............... H01L 45/1246 |
| 10,290,804 B2 | 5/2019 | Ruiz | |
| 10,319,440 B1 | 6/2019 | Kim | |
| 2014/0166959 A1 * | 6/2014 | Bertin | ................... H01L 27/249 |
| | | | 257/2 |
| 2014/0369113 A1 | 12/2014 | Krebs | |

FOREIGN PATENT DOCUMENTS

| | | |
|---|---|---|
| CN | 104253140 B | 2/2018 |
| CN | 107068859 B | 2/2020 |

OTHER PUBLICATIONS

Giannopoulos, et al., "8-bit Precision In-Memory Multiplication with Projected Phase-Change Memory," IEEE, IEDM18-631, 2018, pp. 27.7.1-27.7.4.

Koelmans, et al., "Projected Phase-Change Memory Devices," Nature Communications, 6:8181, DOI: 10.1038/ncomms9181, https://www.nature.com/articles/ncomms9181, Sep. 3, 2015, pp. 1-7.

Le Gallo, et al., "Collective Structural Relaxation in Phase-Change Memory Devices," IBM Research GmbH, WILEY-VCH Verlag GmbH & Co. KGaA, https://doi.org/10.1002/aelm.201700627, Aug. 17, 2018, pp. 1-13.

Wong, et al., "Memory Leads the Way to Better Computing," Nature Nanotechnology, vol. 10, https://doi.org/10.1038/nnano.2015.29, Mar. 2015, pp. 191-194.

International Searching Authority, International Search Report and Written Opinion of the International Searching Authority, International application No. PCT/IB2021/056500, Applicant's Reference No. P202000193, Date of International Filing—Jul. 19, 2021, dated—Oct. 27, 2021, pp. 1-7.

* cited by examiner

- High resistance region
- Low resistance region
- Electrode
- aC projection layer
- Dielectric
- ---- Current

PROJECTED MEMORY DEVICE WITH CARBON-BASED PROJECTION COMPONENT

BACKGROUND

The invention relates in general to the field of projected memory devices. In particular, it is directed to a projected memory device, wherein the projection component essentially comprises amorphous carbon. The invention further concerns related methods of operation and fabrication of such devices.

Machine learning often relies on artificial neural networks (ANNs), which are computational models inspired by biological neural networks in human or animal brains. An ANN comprises a set of connected units or nodes, which compare to biological neurons in animal brains and are therefore called artificial neurons. Signals are transmitted along connections (also called edges) between artificial neurons, similarly to synapses. That is, an artificial neuron that receives a signal processes it and then signals connected neurons. Connection weights (also called synaptic weights) are associated with the connections and nodes; such weights adjust as learning proceeds. Each neuron may have several inputs and a connection weight is attributed to each input (the weight of that specific connection). Such connection weights are learned during a training phase and thereby updated. The learning process is iterative: data cases are presented to the network, typically one at a time, and the weights associated with the input values are adjusted at each time step.

Several types of neural networks are known, starting with feedforward neural networks, such as multilayer perceptrons, deep neural networks and convolutional neural networks. Besides, new types of neural networks emerge, such as spiking neural networks. Neural networks are typically implemented in software. However, a neural network may also be implemented in hardware, e.g., as a resistive processing unit (e.g., involving a crossbar array structure) or an optical neuromorphic system. That is, a hardware-implemented ANN is a physical machine that clearly differs from a classic computer (e.g., general- or specific-purpose computer) in that it is primarily and specifically designed to implement an ANN (e.g., for training and/or inference purposes). A hardware-implemented ANN (or physical ANN) may typically be emulated with a classic computer with not as high an efficiency, while it may not be configured to perform multiple data-processing tasks as a classical computer does.

Nanoscale memory devices are known, such as memristive devices, the resistance of which depends on the history of electric signals applied through the device. Recent advances in such memory devices are making such a technology ever more relevant to industrial applications. For example, such memory devices may be used as building blocks of new computing paradigms, such as brain-inspired computing and memcomputing. In particular, such devices may be used in a physical ANN, such as crossbar array structures of resistive processing units.

However, there are key challenges to overcome, such as the high programming power required, noise, and resistance drift. To address such issues, the concept of a projected memory device has been recently introduced (see, e.g., Koelmans, W. W. et al. Projected phase-change memory devices. Nat. Commun. 6:8181 doi: 10.1038/ncomms9181 (2015), and references cited therein), wherein the physical mechanism of resistance storage may be decoupled from the information-retrieval process. A projected memory device may notably use a phase-change storage mechanism, allowing multiple resistance states to be programmed. Such a device may exhibit remarkably low drift and excellent noise performance.

Projected phase change memory devices are normally based on metal nitride projection materials, which makes it possible to lower drift and conductance fluctuations. Projected phase change memory devices are subject to certain design rules, for the projection mechanism to work. Such rules exploits the highly nonlinear field-dependent electrical transport properties of resistive memory materials (e.g., phase change materials). *A minima*, the resistance of the projection component must fulfil the following conditions:

- The resistance $R_{AMOR}$ of the amorphous part of the resistive memory material must be (e.g., much) higher than the resistance $R_{PROJ}$ of the projection component, i.e., $R_{AMOR} \gg R_{PROJ}$;
- The resistance $R_{CRYS}$ of the crystalline part of the resistive memory material must be (e.g., much) lower than $R_{PROJ}$, i.e., $R_{CRYS} \ll R_{PROJ}$; and
- The resistance $R_{AMOR,ON}$ of the amorphous part (e.g., in the ON-state) must be (e.g., much) lower than $R_{PROJ}$, i.e., $R_{AMOR,ON} \ll R_{PROJ}$.

However, the resistance of the resistive memory material depends both on the material and its thickness. In order to maintain commensurate properties when scaling the memory segment, the projection component must be consistently altered.

There are a few challenges to using metal nitrides (e.g., TiN, TaN, etc.) as materials for the projection component. A first difficulty is the tunability of the resistance. In metal nitrides, resistivity may be scaled by modulating the nitrogen content. The scaling behavior is generally non-linear and electrical characteristics get noisier with higher nitrogen content. In addition, the fabrication of metal nitrides is challenging. Metal nitrides thin films are generally obtained via reactive deposition schemes, which require maintaining control on the quality and quantity of nitrogen, and the deposition temperature, while making sure that resistive memory material remains unaffected. Moreover, metal nitrides have a poor thermal stability. Most metal nitrides undergo phase segregation at high temperatures and oxidation when exposed to ambient conditions, which may modify the electrical characteristics of the projection component and thereby affect the functionality of the projected memory device. For completeness, such materials adhere poorly to phase change materials and to oxides, as needed for fabricating memory cells. Occurrence of interfacial layers between the projection component and the phase change component, or delamination of the projection component may harm the functionality of the memory device.

There have been various approaches in developing a projected memory device or components thereof. For example, U.S. Pat. No. 10,290,080 (the "080 patent") purportedly discloses a nano-particle-based resistive memory device. However, the 080 patent does not disclose that the projection component comprises a non-insulating material that essentially includes carbon. Additionally, the 080 patent does not provide any detail as to how tunability is achieved in the resistivity of the projection layer but rather only discloses methods related to the nanoparticle core memory element without ever addressing the choice or tunability of the projection material. In another example, U.S. Pat. No. 10,319,440 (the "440 patent") purportedly discloses a void control of confined phase change memory. However, the 440 patent does not disclose that the projection component comprises a non-insulating material that essentially includes carbon. The 440 patent also does not disclose that the projection component has a tunable electrical resistance to impact the read operation substantially more than the write operation. The 440 patent further does not disclose that the resistance of the projection layer is modulated through a deposition method, a thermal treatment, a thickness control, and/or a doping. In a further example, U.S. Pat. No. 7,932,101 (the "101 patent") purportedly discloses a thermally contained/insulated phase change memory device. However, the 101 patent does not disclose a projected memory device nor does the 101 patent disclose a step where a projection component (e.g., called a liner) is used or manufactured, which is also in electrical contact with the memory segment. In an additional example, U.S. Pat. No. 8,309,407 (the "407 patent") purportedly discloses carbon-based films having sidewall liners that serve as a protective layer and/or a series resistor. However, the carbon layer in the 407 patent does not serve the purpose of a projection layer (e.g., a projection layer for a projected memory device that must be in parallel with the memory stack). Additionally, in the manner described in the 407 patent, the sidewall liner is placed in parallel to the memory stack. Such an arrangement is an oxygen-poor dielectric material, thus not used for projection. Accordingly, the 407 patent does not cover the use of carbon-based material as a parallel projection component to the memory switching material. Thus, in light of all the above issues and as illustrated in the above approaches, a novel approach to projected memory devices is needed.

SUMMARY

According to a first aspect, the present invention is embodied as a projected memory device. The device comprises two electrodes, as well as a memory segment and a projection component. The projection component and the memory segment form a dual element that connects the two electrodes. The projection component extends parallel to and in contact with the memory segment. The memory segment comprises a resistive memory material, while the projection component includes a non-insulating material (e.g., a thin film of non-insulating material) that essentially comprises carbon. Preferably, the non-insulating material essentially comprises amorphous carbon. For instance, in embodiments, the projection component essentially comprises amorphous carbon.

Using carbon and, in particular, amorphous carbon as a main component of the projection component allows unprecedented flexibility to be achieved when tuning the electrical resistance of the projection component. This notably allows the physical mechanism of resistance storage to be better decoupled from the information retrieval process. More precisely, using carbon makes it possible to more easily tune the memory device performance, e.g., the resistance window and the fraction of current flowing through the memory segment. As a consequence, the electrical resistance of the projection component may be tuned during the fabrication, so as to impact the read operation substantially more than the write operation, as discussed below in reference to particular embodiments of the invention.

To start with, the projected memory device is preferably configured to allow information to be written in and read from the resistive memory material upon applying a write signal and a read signal, respectively. Such signals are meant to be applied through the memory segment via the two electrodes, in operation. The resistive memory material is typically designed so as to partly undergo a phase transition upon applying said write signal. Interestingly, the non-insulating material may have an electrical resistance that is tuned so as to allow a current resulting from an applied signal to flow through the non-insulating material in a proportion that is substantially larger, if not much larger, for a current resulting from the read signal applied after said phase transition (as obtained upon applying said write signal) than for a current resulting from the write signal, in operation.

The resistive memory material may for example be designed so as for said phase transition to lead to increase a crystalline fraction of the resistive memory material with respect to an amorphous fraction thereof upon applying said write signal. Still, a residual portion of the resistive memory material typically remains amorphous after having applied the write signal, in operation. Now, the electrical resistance of the non-insulating material may be tuned so as for the non-insulating material to provide a current path of lower electrical resistance than said residual portion of the resistive memory material for the current resulting from the read signal applied. This current path has a length that depends on a size of said residual, amorphous portion of the resistive memory material, in operation.

In preferred embodiments, the resistive memory material is further designed so as for the projected memory device to allow a plurality of programmable resistance states by applying respective write signals. Still, the electrical resistance of the non-insulating material may advantageously be tuned so as for a current path provided by the non-insulating material to have a lower electrical resistance than any residual, amorphous portion of the resistive memory material as obtained in any of the plurality of programmable states, for the current produced by the read signal, in operation.

As said, the non-insulating material may essentially comprise amorphous carbon. Still, the non-insulating material is preferably doped with one or more of the following elements: oxygen (O), hydrogen (H), and nitrogen (N).

In embodiments, the projection component is configured as a layer coating said resistive memory material. The electrical sheet resistance of the layer of non-insulating material is preferably between 0.01 and 40 Megaohms-per-square. Said layer of non-insulating material may for instance have an average thickness that is between 1 and 20 nm, where the thickness is measured perpendicularly to an average plane of the layer. Note, the device may, more generally, include one or more projection components, each configured as, e.g., a layer coating the resistive memory material. In variants to layers, the projection component may notably be configured as a sheath that surrounds, at least party, the resistive memory material.

In embodiments, the resistive memory material is a phase change material that comprises one of GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, or AlSb. The phase change material is preferably doped with an element such as C, Ni, Ce, and Si. The resistive memory material too may possibly be configured as a layer (e.g., in a lateral device configuration), an average thickness of which may for instance be between 1 and 50 nm. Again, the thickness is measured perpendicularly to an average plane of the layer.

For example, the non-insulating material may be configured as a layer that essentially comprises amorphous carbon and has an average thickness that is between 1 and 20 nm, while the resistive memory material is configured as a layer that has an average thickness between 1 and 50 nm and is coated by the layer of non-insulating material.

In preferred embodiments, the projected memory device additionally comprises a substrate (e.g., silicon) and a first $SiO_2$ layer, which extends above the substrate. In that case, the layer of non-insulating material extends case over the $SiO_2$ layer and the layer of resistive memory material extends on the layer of non-insulating material. A second $SiO_2$ layer may possibly extend above the layer of resistive memory material. Additional layers of material may be present.

According to another aspect, the invention is embodied as a method of using a projected memory device as described above. That is, the method relies on a projected memory device with a memory segment a projection component, each connecting two electrodes. The method revolves around writing information to and reading information from the resistive memory material by applying a write signal and a read signal, respectively. Such signals are applied through the memory segment via the two electrodes. The resistive memory material locally undergoes a phase transition upon applying said write signal. E.g., the write signal may be applied so as to increase a long-range order of the resistive memory material. In practice, an amorphization signal is typically applied prior to applying said writing signal, so as to amorphize, at least partly, the resistive memory material.

As evoked earlier, the non-insulating material of the projected memory device preferably has an electrical resistance tuned so as to allow a current resulting from an applied signal to flow through the non-insulating material in a proportion that is substantially larger for the read signal applied than for the write signal applied.

In embodiments, each of the write signal and the read signal applied is a constant voltage signal. The amplitude of the write signal applied is substantially larger than an amplitude of the read signal applied.

According to a final aspect, the invention is embodied as a method of fabricating a projected memory device. The method aims at fabricating a projected memory device with a memory segment and a projection component, as described above. In particular, the projected memory device may be fabricated so as for the non-insulating material to essentially include amorphous carbon. The fabrication comprises tuning a resistivity of the non-insulating material in accordance with a resistivity of the resistive memory material.

Preferably, the fabrication includes depositing the resistive memory material and depositing the non-insulating material so as for the latter to have a given resistivity. The non-insulating material may for instance be deposited using a physical vapor deposition technique, a chemical vapor deposition technique, or a chemical growth technique.

In embodiments, the resistivity of the non-insulating material is tuned by doping the amorphous carbon with one or more of oxygen, hydrogen, and nitrogen. The amorphous carbon is preferably doped while depositing the non-insulating material, by depositing the latter in an atmosphere comprising the dopants, i.e., oxygen, hydrogen, and/or nitrogen.

In preferred embodiments, the resistivity of the non-insulating material is further tuned by annealing the amorphous carbon in an inert atmosphere, after having deposited the non-insulating material. In variants, the resistivity of the non-insulating material is tuned via a through back sputtering technique performed in an inert atmosphere, after having deposited the non-insulating material.

Devices and methods embodying the present invention will now be described, by way of non-limiting examples, and in reference to the accompanying drawings.

BRIEF DESCRIPTION OF SEVERAL VIEWS OF THE DRAWINGS

The accompanying figures, wherein like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which:

FIGS. 3A-E depict projected memory devices according to various embodiments.

FIGS. 5A-B depict projected memory devices according to various embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

The present method and its variants are collectively referred to as the "present methods". All references Sij refer to method steps of the flowchart of FIGS. 8-10, while numeral references pertain to physical parts or components of projected memory devices and memristive crossbar arrays as depicted in FIGS. 1-5.

Figure 1A:
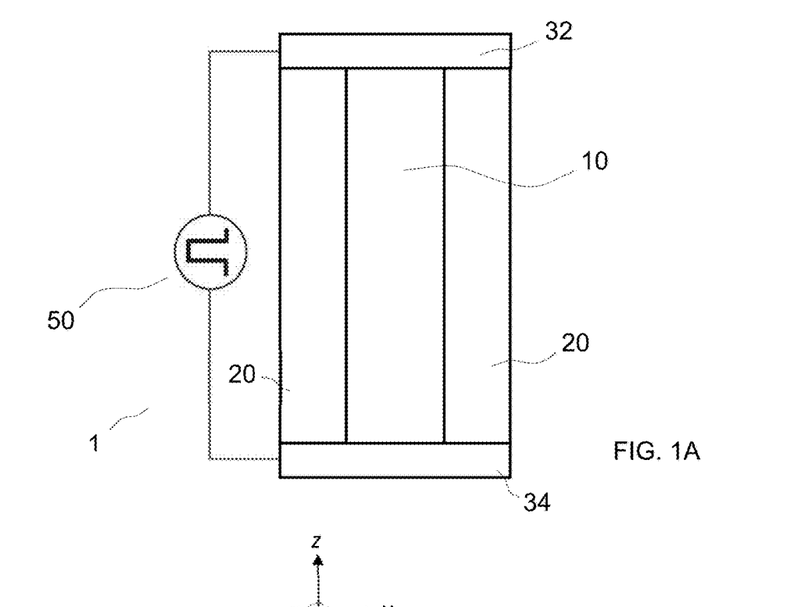
FIGS. 1A-C depict projected memory devices in two-dimensional cross-sectional views at a first perspective according to various embodiments.

A first aspect of the exemplary embodiments is now described, which concerns a projected memory device. Examples of such projected memory devices 1, 1a-1i are shown in FIGS. 1-3, and 5. For example, FIG. 1a shows a device 1 comprising two electrodes 32, 34, as well as a memory segment 10 and a projection component 20. The projection component is also referred to as a "liner" in the literature.

Figure 1B:
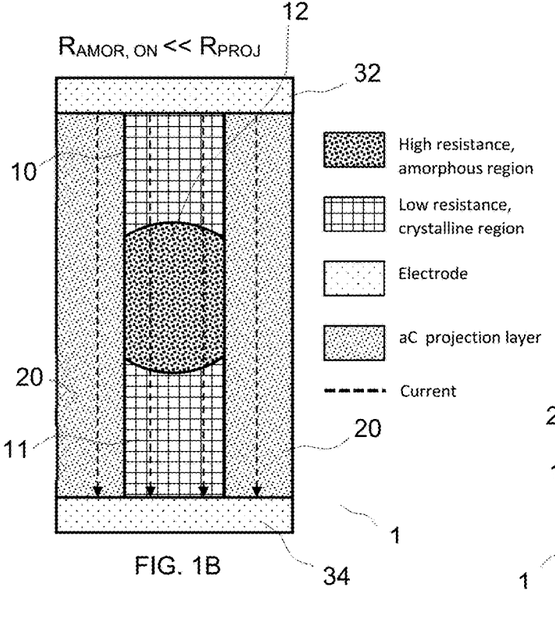
Figure 1C:
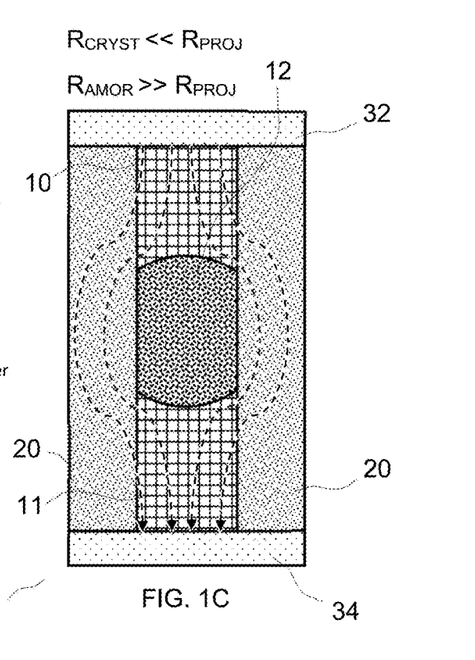
Figure 2A:
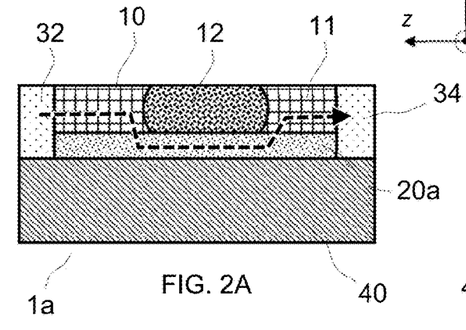
FIGS. 2A-D depict projected memory devices in two-dimensional cross-sectional views at a second perspective according to various embodiments.
Figure 2B:
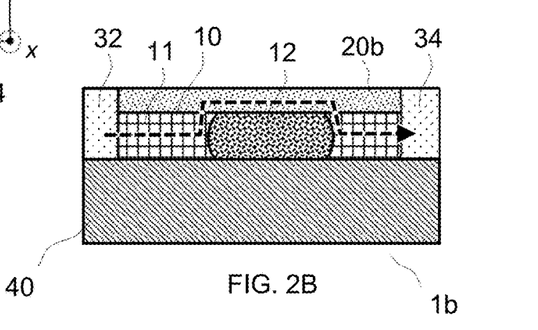
Figure 2C:
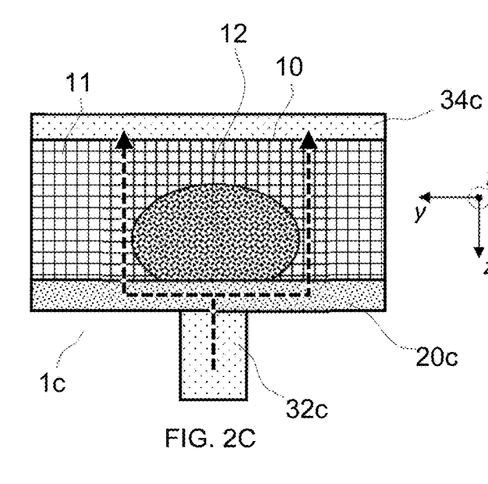
Figure 2D:
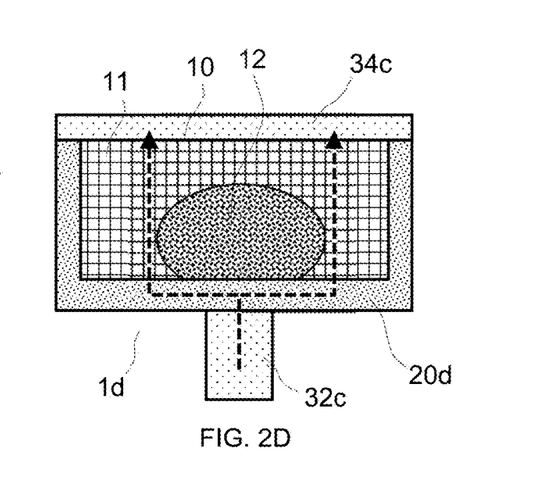

The memory segment 10 and the projection component 20 form a dual element, which has a whole, connects the two electrodes. In the example of FIGS. 1, 2A and 2B, each of the memory segment 10 and the projection component 20 connects the two electrodes 32, 34. However, this configuration is only exemplary and other configurations may be used, see, e.g., FIG. 2C or 2D, as will be described in detail below. The dual element 10, 20 connects the electrodes in each case. The projection component 20 extends parallel to the memory segment 10. That is, at least one surface of the projection component 20 extends parallel to at least one surface of the memory segment 10. In addition, the projection component 20 is in contact with the memory segment 10. Note, the projection component 20 preferably is in direct mechanical contact with the memory segment 10. In variant, a thin interfacial layer may be needed, interposed between a surface of the projection component 20 and a surface of the memory segment 10 for adhesion purposes. In all case, the projection component 20 is arranged so as to ensure a good electrical contact with the memory segment 10.

The projected memory device may, in general, comprise one or more projection components 20. Or the projection component may be regarded as comprising one or more parts.

Figure 3A:
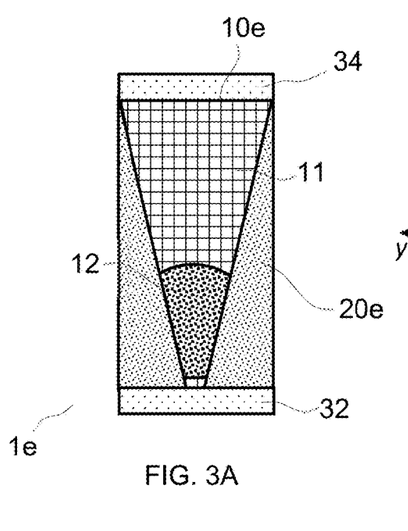
FIGS. 3A-D are two-dimensional cross-sectional views at a third perspective.
Figure 3B:
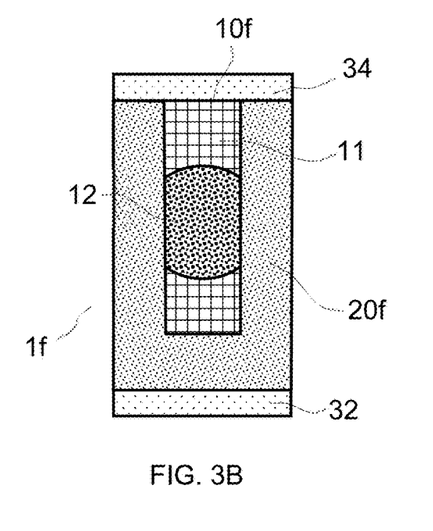
Figure 3C:
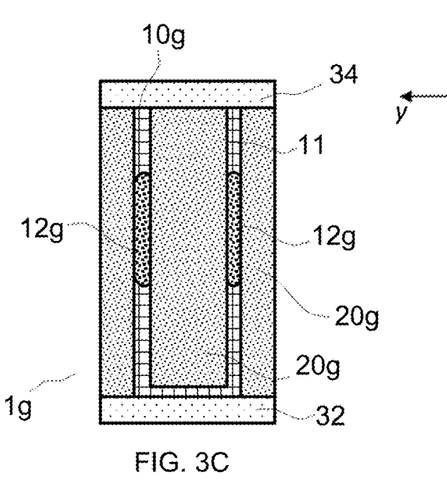
Figure 3D:
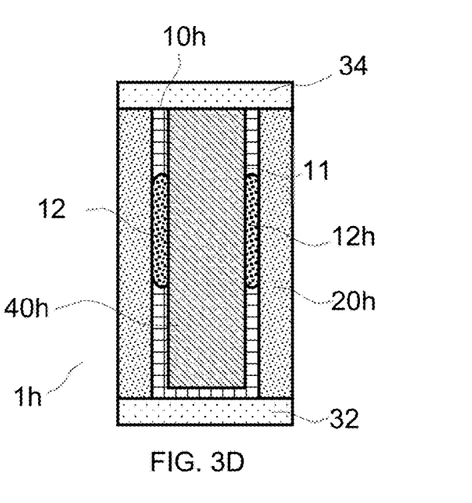
Figure 3E:
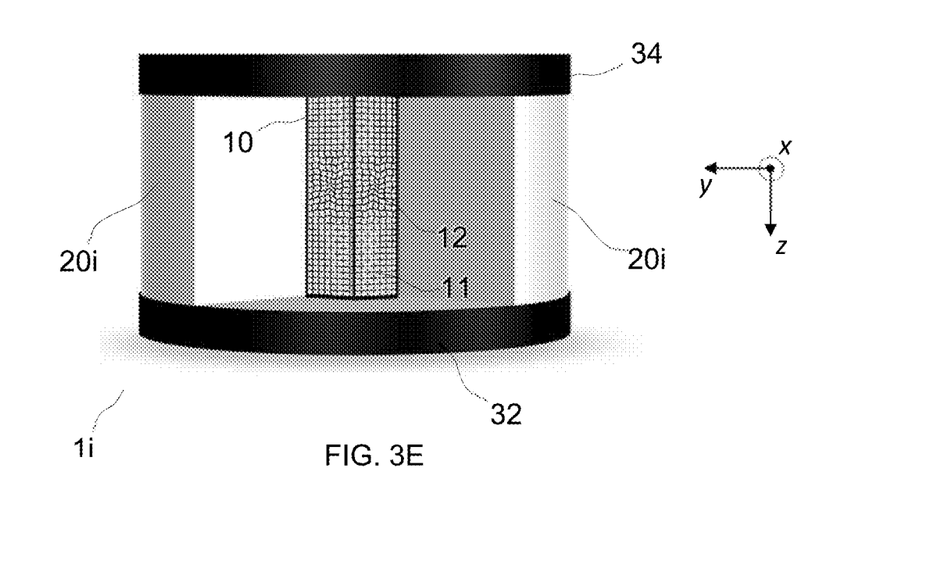
FIG. 3E is a three-dimensional view of a device where the projection component is formed as a sheath.

For instance, in the example of FIG. 1, two projection layers extend on each side of the memory segment 10 and are adhered thereto. In variants, the device 1a, 1b may include a single projection layer 20a, 20b, e.g., extending below or on top of the memory segment 10, as in FIGS. 2A and 2B. In other variants, the devices 1c, 1d may have a "mushroom" configuration, where the projection layer 20c extends flat under the memory segment 10 (FIG. 2C) or partly surrounds 20d the memory segment 10 (FIG. 2D), so as to connect two electrodes 32c, 34c, which may have various possible shapes. Additional configurations are shown in FIGS. 3A-3D, where the devices 1e-1h comprise, each time, one or more projection components 20e-20h having various configurations. Together with correspondingly shaped memory segments 10e-10f, the projection components 20e-20h connect a pair of electrodes 32, 34. For example, the projection components may be tapered 20e (FIG. 3A), have a hollow shape 20f (FIG. 3B), so as to partly surround the segment 10, or include several, interdigitated segments 20g (FIG. 3C), some of which may be replaced by a dielectric material 40h (FIG. 3D).

Further configurations may be contemplated. In general, the projection component 20 may be fabricated as a layer extending either below or above the memory segment 10. It may also be fabricated on either lateral sides or both lateral sides of the phase change layer, it being noted that the projection memory devices may have different lateral geometries (e.g., when viewed from the top). In more sophisticated embodiments, the projection component may also partly or fully surround the memory segment. Note, the projection component may also serve as an electrode, connected to an electrical contact. In that case, a portion of the projection component plays the role of one of the two electrodes 32, 34.

As usual, the memory segment 10 comprises a resistive memory material 11, 12, which may for instance include or consist of a phase change memory (PCM) material, such as Sb, AgInSbTe (AIST), or GeTe. More generally, the PCM material may comprise Sb, Ge, and/or Te elements. It may for example include one of the following materials: GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb. Other PCM materials may also be contemplated. In variants, the resistive memory material may be a conductive bridge memristor (e.g., a filamentary switching material, such as a metal oxide or a chalcogenide glass).

The projection component 20 may include a non-insulating material that essentially comprises carbon. That is, the non-insulating material of the projection component 20 is typically made of 90 or even 95 wt % carbon, or more. According to a particular implementation, the non-insulating material may include amorphous carbon. The projection component 20 may essentially be made of amorphous carbon (hereafter abbreviated as aC). By "amorphous", it is meant that the aC material is essentially non-crystalline and lacks long-range order. Short-range order may exist, but with substantial deviations (e.g., 5% deviation or more) of the interatomic distances and/or interbonding angles with respect to crystalline forms of carbon, e.g., graphite lattice or diamond lattice. The aC material may essentially comprise tetrahedral amorphous carbon. The aC compound may also comprise small non-amorphous regions, e.g., microcrystalline or nanocrystalline regions. The aC projection component is assumed to remain essentially and, in some implementation, entirely amorphous.

The aC material preferably comprises impurities and/or dopants. For example, the aC material may be doped, e.g., with one or more of Si H, N, and O, which element prove useful to improve chemical stability, as well as retention and endurance of the memory elements.

Using carbon and, in particular, amorphous carbon, as a main component of the projection component allows unprecedented flexibility to be achieved when tuning the electrical resistance of the projection component, taking into account the design rules evoked in the background section. More precisely, using carbon as material for the projection component allows the physical mechanism of resistance storage to be much better decoupled from the information retrieval process. In particular, this makes it possible to more easily tune the memory device performance, e.g., the resistance window and the fraction of current flowing through the memory segment 10. As a result, the electrical resistance of the projection component 20 may be tuned during the fabrication, so as to impact the read operation substantially more than the write operation, as explained below in reference to particular embodiments.

A resistance-tunable projection component 20 comprising carbon may thus advantageously be used for drift and noise correction in a resistive memory device 1. For example, according to experiments conducted on 3-nm thick Sb line cells, where some of the cells included a 8 nm aC projection layer, whereas other cells did not comprise any aC projection layer, such experiments have shown that it is possible to use programming currents and powers that are comparable in both cases. However, a four-fold resistance drift reduction may be obtained due to aC projection layers. In addition, further experimentation has provided evidence that the devices 1 may be reliably switched at least 1,000 times between two resistance states.

All this is now described in detail, in reference to particular exemplary embodiments. To start with, functional properties of the projection component and the memory segment are described in detail, referring more particularly to FIGS. 1B and 1C.

In general, the projected memory device 1 is configured to allow information to be written in and read from the resistive memory material 11, 12. Such operations are typically performed alternately, as later described in reference to FIG. 8. These operations require applying write signals and read signals, respectively. Such signals are applied through the memory segment 10, via the two electrodes 32, 34. So, the device 1 is typically meant to be connected to an electrical circuit 50, see FIG. 1A. The resistive memory material 11, 12 may for example be chosen so that it will partly undergo a phase transition upon applying a write signal. For example, a phase transition occurs locally, in one or more regions only of the memory segment 10, upon applying said write signal.

Meanwhile, the non-insulating material may have an electrical resistance tuned so as to be more permissive to read currents. That is, this electrical resistance allows the current resulting from the applied signal to flow through the non-insulating material in a proportion that is substantially larger for a current resulting from the read signal (after the partial phase transition obtained with the write signal) than for a current resulting from the write signal itself, in operation.

Note, in that respect, that the projection component 20 must be in contact with the segment 10 at the level of the amorphous region, at least. Accordingly, the projection component is not required to be in contact everywhere with the memory segment. In practice and according to an exemplary implementation, the projection component 20 is more easily fabricated so as to entirely coat the resistive memory material of the segment 10, in full length, as assumed in FIGS. 1-3. That is, at least one side of the segment 10 is directly adhered to the projection material 20, in embodiments. Note, whether this shall be the case nevertheless depends on the desired configuration. For example, in FIG. 3D, a lower side of the segment 10h is coated by a dielectric instead of a projection material 20h.

In particular, the resistive memory material 11, 12 may be designed and meant to be operated in such a manner that the partial phase transition (e.g., as obtained upon applying a write signal) leads to increase the crystalline fraction of the resistive memory material with respect to its amorphous fraction, as assumed in FIGS. 1-3. Still, a residual portion of the resistive memory material 12 is assumed to remain amorphous, after having applied the write signal, in operation. Now, the electrical resistance of the non-insulating material may be tuned so as for the non-insulating material to provide a current path of lower electrical resistance than the residual, amorphous portion of the resistive memory material 11, 12 for the current resulting from the read signal applied, as illustrated in FIG. 1C. Note, this current path has a length that depends on the size of this residual portion, in operation.

Currents flow around the residual amorphous region upon reading (FIG. 1C), while they mostly go though the material 11, 12 upon application of the write signals (FIG. 1B).

More precise explanations follow. Beyond a threshold field, the amorphous material undergoes a so-called electronic threshold switching, leading to a low-resistive state ON state. During the write process the resistance of the projection component 20 is significantly higher than the ON-state resistance of the amorphous region, and most of the current flows through the resistive memory material 11, 12. During the low-field read process, however, a substantial fraction of the current bypasses the highly resistive amorphous region and flows through that part of the projection component 20 that extends parallel to and in contact with this region. Hence, the resistance of the device 1 is dominated by the resistance of that part of the projection component 20 in this case.

Figure 6:
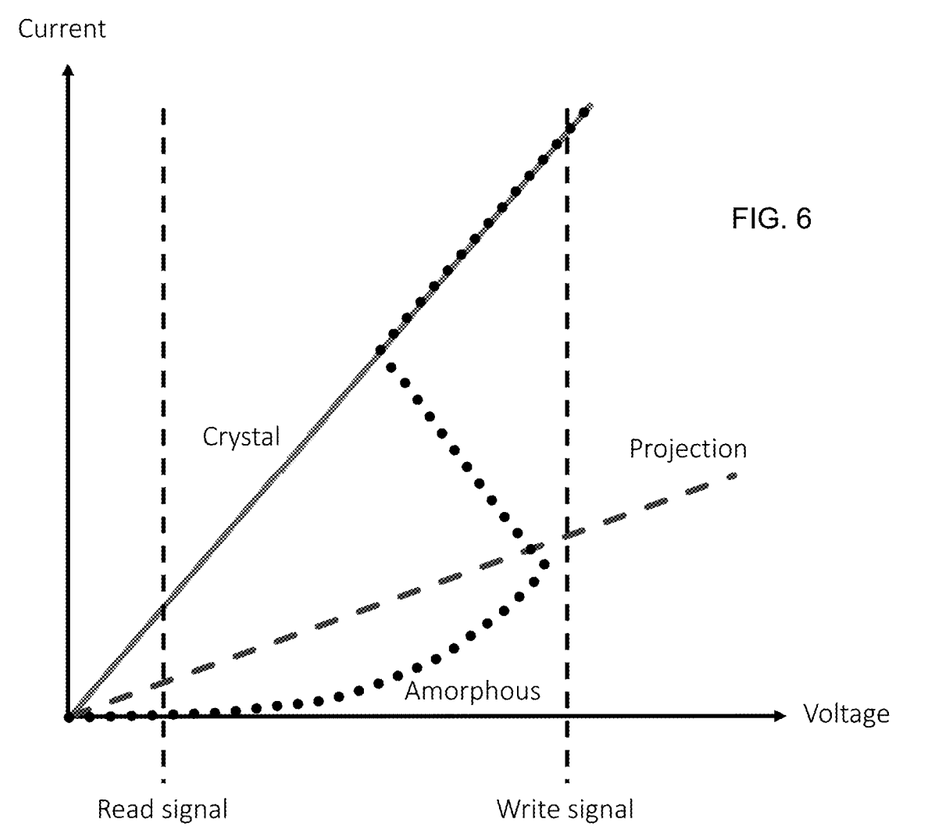
FIG. 6 is a plot that schematically depicts desired current-voltage (I-V) characteristics of the resistive memory material and the non-insulating material of the projection component.

In more detail, the resistance of the projection material 20 may be judiciously chosen such that it has only a marginal influence on the write operation (e.g., during which the phase transition occurs), but a significant influence on the read operation. The desired I-V characteristics corresponding to the phase-change segment and the projection component are schematically depicted in FIG. 6. The resistance of the phase-change section in the amorphous phase is denoted by $R_{AMOR}$. The resistance $R_{CRYST}$ is the resistance in the crystalline phase. The projection component has a resistance noted $R_{PROJ}$. Assume that voltage signals are used. In write mode, the write voltage exceeds the threshold voltage, and the amorphous section goes into the ON-state with a resistance $R_{AMOR,ON}$ that is lower than $R_{PROJ}$. This may ensure that most of the current flows through the phase-change segment, resulting in Joule heating and subsequent phase transition. In read mode, because $R_{PROJ}$ may be chosen to be much lower than $R_{AMOR}$ at low fields, the current preferentially flows through a section of the projection component that is parallel to the amorphous section. Elsewhere, the current will preferentially flow through the crystalline section.

The current fractions typically differ by one order of magnitude in each case. For instance, the fraction of current passing though the projection component 20 during a read operation may typically be 10 times larger than the fraction of current passing through the amorphous portion of the resistive memory material 11, 12, while it is typically 10 times less than the fraction of current passing through the crystalline and melted portion during the write operation.

Figure 7:
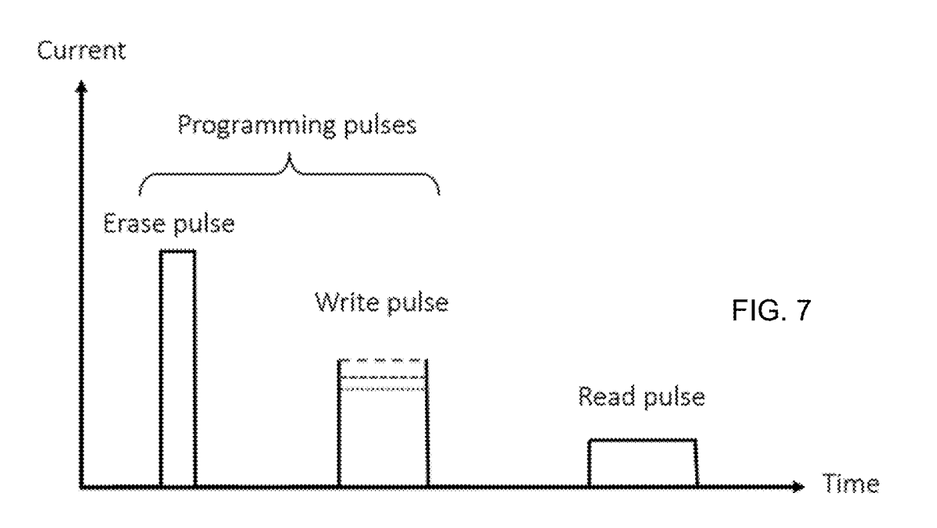
FIG. 7 is a plot representing current pulses applied to operate projected memory devices, as involved in typical embodiments.

A typical sequence of applied signals is shown in FIG. 7. First, an amorphization pulse is applied. For example, a short high current pulse (RESET) is applied to bring the PCM to a high-resistance state. As a result, a substantial fraction of the PCM becomes amorphous. In variants, a constant voltage pulse may be used to achieve the same. Next, a write pulse, e.g., a long low current pulse (SET) is applied, which decreases the amorphous fraction of the PCM and bring the PCM to a lower resistance state. The PCM is still partly amorphous but the crystalline fraction is now relatively more important. So, write signals lower the amorphous fraction of the memory segment 10. Note, train of pulses may be used in lace of single pulses, be it for the SET or RESET operation. The pulse amplitude or the number of pulses may be modulated to achieve a desired resistance state. Again, a constant voltage pulse may be used for the write signal, instead of a current pulse). Finally, a read (constant) voltage pulse may be applied to read a current state of the memory segment.

As noted above, voltage signals may be applied for both the amorphization and the write operations. In that case, the write voltage signal normally has an amplitude that is substantially larger than the amplitude of the read voltage signal. In both cases, the projection component is more permissive to currents flowing during the read operation than to current flows generated during the write operation, owing to the adequately tuned resistance of the projection component.

Note, the present projected memory devices may advantageously be designed so as to enable a plurality of resistance states to be programmed, and correspondingly a plurality of cell states to be achieved. Plus, such devices may be reversibly switched between such conductance states. That is, the resistive memory material 11, 12 may further be designed so as for the projected memory device 1 to allow a plurality of programmable resistance states by applying respective write signals, e.g., of distinct intensity (see FIG. 7). In that case, the projection component 20 needs to account for this variation. According to the exemplary embodiments, amorphous carbon may be tuned in its resistivity to account for these intermediate states, by exploiting properties of the corresponding I-V curves (one example of which is shown in FIG. 6). That is, the electrical resistance of the non-insulating material may be tuned so as for the current path it provides to have a lower electrical resistance than any residual, amorphous portion of the resistive memory material 11, 12 as obtained in any of the plurality of programmable states, for the current produced by the subsequent read signal, in operation.

Note, when applying write voltage signals to switch between the different states, each write voltage signal applied has an amplitude that is substantially larger than the amplitude of the read voltage signal. As a further remark, it is normally possible to incrementally switch states, without necessarily having to reset (amorphize) the memory segment each time.

Figure 5A:
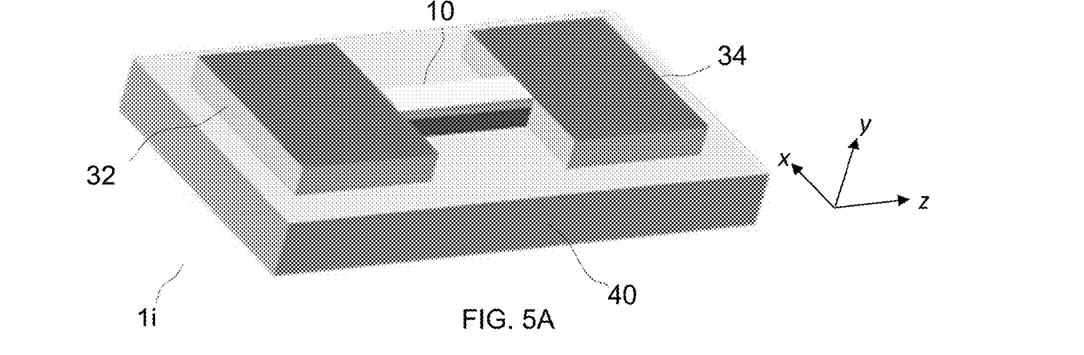
FIG. 5A is a three-dimensional view of another device.
Figure 5B:
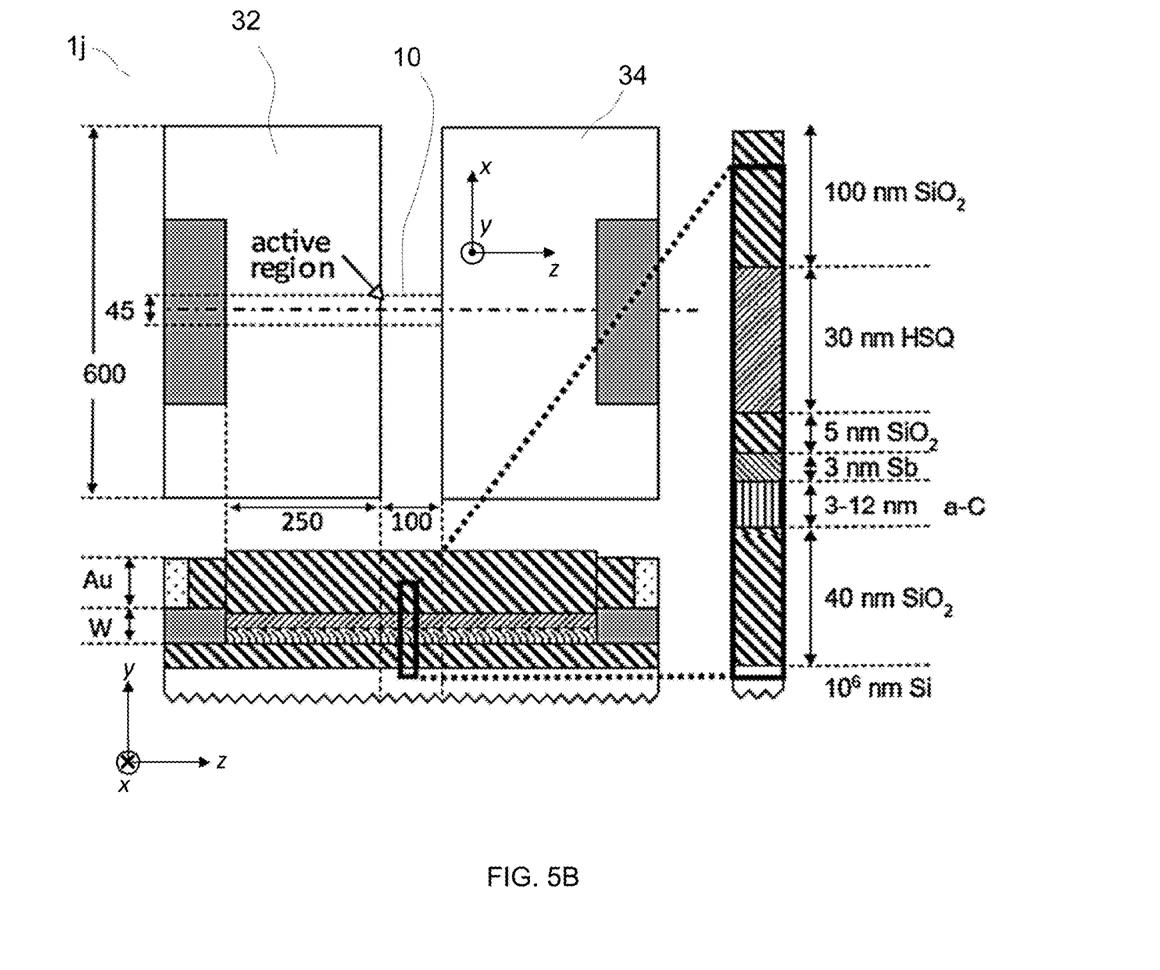
FIG. 5B is a corresponding cross-sectional view of FIG. 5A.

At present, a particularly efficient embodiment of a projected memory device 1*j* is discussed in reference to FIGS. 5A and 5B. Here, the device 1*j* includes a projection component configured as a mere layer coating the resistive memory material, see FIG. 5B, RHS. The resistive memory material is assumed to essentially consist of Sb in this example. In variants, it may for instance be a 15-nm-thick AIST layer or a 30-nm-thick GeTe layer.

More generally, the resistive memory material 11, 12 will typically have an average thickness that is between 1 and 50 nm. As further indicated in FIG. 5B, the layer of non-insulating material (the projection layer) has an average thickness that is between 3 and 12 nm. In other embodiments, this average thickness of the non-insulating material layer may range from 1 to 20 nm. Note, the thickness is measured perpendicularly to an average plane of the layer, e.g., perpendicular to the plane (x, z) in FIGS. 1, 2A-2B, and 5A.

The electrical resistance of this layer is preferably between 0.1 and 1 Megaohms-per-square. More generally, though, the tuned resistance of the projection component will typically be between 0.01 and 40 Megaohms-per-square in practice.

Figure 4:
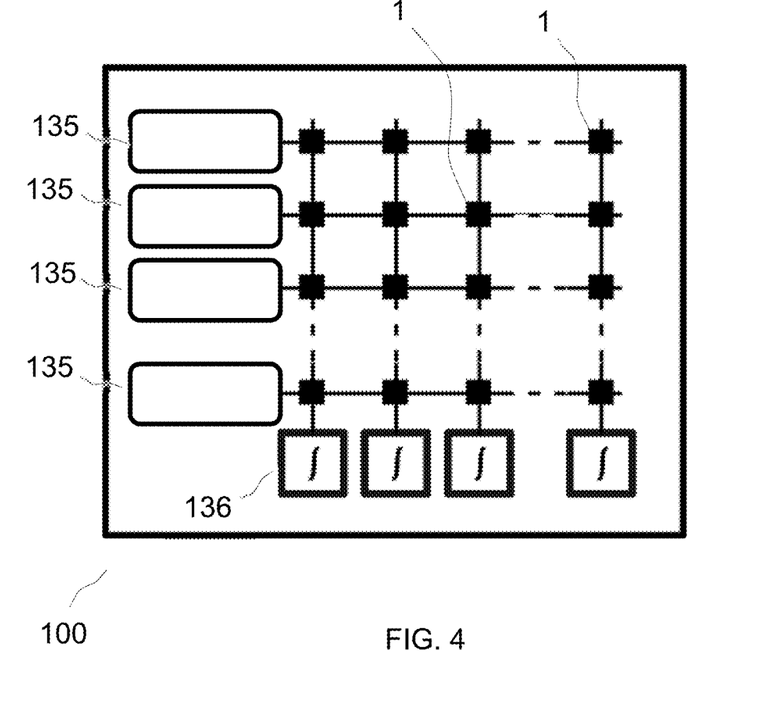
FIG. 4 schematically represents a memristive crossbar array of a neuromorphic device comprising several projected memory devices according to embodiments.

The device 1*i* shown in FIGS. 5A and 5B further comprises a substrate 40 (typically silicon, or Si), a first $SiO_2$ layer that extends above the substrate 40, under the layer of non-insulating material and the layer of resistive memory material, as well as a second $SiO_2$ layer, which extends above the layer of resistive memory material. As further seen in FIG. 5B, the device 1*i* may additionally comprise a layer of hydrogen silsesquioxane (HSQ), for fabrication reasons, this layer extending above the second $SiO_2$ layer. Additional layers may be present, e.g., a third $SiO_2$ layer extending above the HSQ layer, for example. Preferred dimensions of the device are indicated in FIG. 5B The present projected memory devices may advantageously be used in a memristive crossbar array of a neuromorphic memory system. FIG. 4 shows an example of such a crossbar array structure, which includes N input lines (horizontal lines) and W output lines (vertical lines), where N is normally equal to W, though not necessarily. The crossbar array structure may comprise one or more projected memory devices 1 per junction. In addition, the memristive crossbar array 100 includes input circuits 135, such as pulse width modulation (PWM) circuits, which are used to controllably generate signals needed to write to the array 100 (and also read from the array 100 should the latter be used as a neuromorphic memory device). Write heads (and possibly read heads, not shown) are connected to the input lines (horizontal lines in FIG. 4) via a respective PWM circuit 135. Read heads are otherwise connected to outputs of the crossbar array to read result from the multiply-accumulate operations and return such results to an external controller (not shown). Standard readout circuits 136 may be used to read output currents from the output lines (shown as vertical lines). As evoked just above, beyond neuromorphic applications, the crossbar array shown in FIG. 4 may also be used as a neuromorphic memory device.

Figure 8:
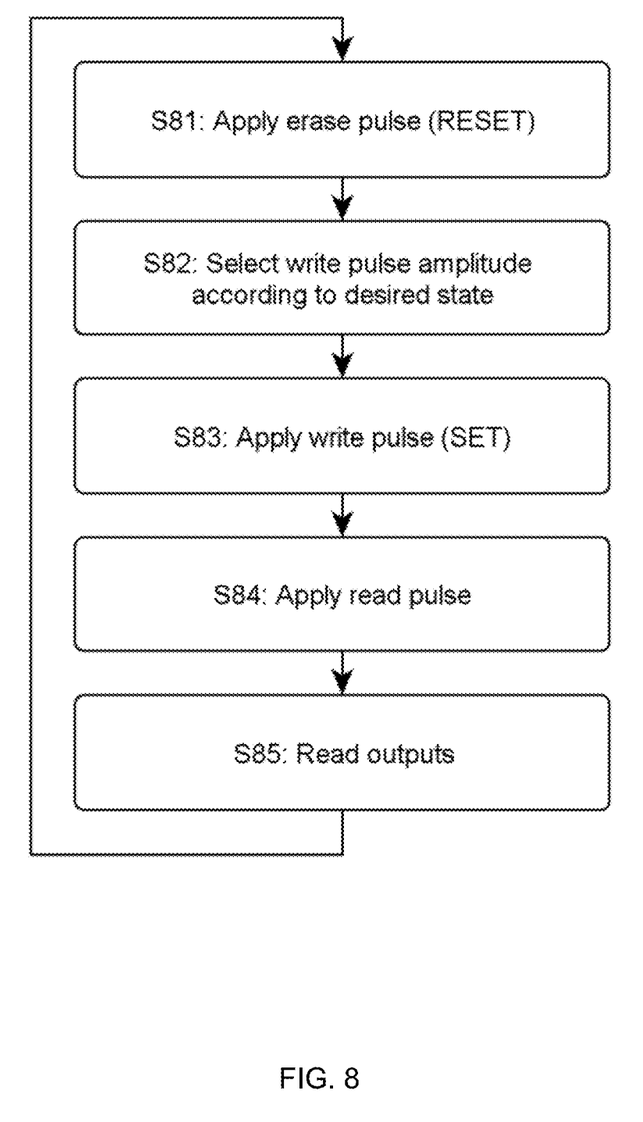
FIG. 8 is a flowchart illustrating high-level steps of a method of operating a projected memory device, according to embodiments.

Referring to FIG. 8, another aspect of the exemplary embodiments is now described, which concerns a method of using or operating a projected memory device. Main aspects of this method have already been addressed implicitly while describing preferred projected memory devices. Therefore, such aspects are only briefly described in the following.

This method relies on a projected memory device 1 such as described earlier, e.g., having two electrodes 32, 34 and a dual element connecting the two electrodes 32, 34, where this dual element includes a memory segment 10 and a projection component 20. The latter extends parallel to and in contact with the memory segment 10. The memory segment 10 includes a resistive memory material 11, 12, while the projection component comprises a non-insulating material that essentially comprises carbon, e.g., amorphous carbon.

The method revolves around writing S81-S83 information to the resistive memory material 11, 12 and reading S84-S85 information from the resistive memory material 11, 12. Such steps are typically performed alternately in practice, though not necessarily. This is basically achieved by applying S83 a write signal and by applying S84 a read signal, respectively. Such signals are applied through the memory segment 10 via the two electrodes 32, 34, as discussed earlier in reference to FIG. 7. In particular, the resistive memory material 11, 12 may locally undergo a phase transition upon applying S83 a write signal. Applying write signals typically cause to increase the long-range order of the resistive memory material 11, 12, by increasing the crystalline fraction of the latter.

As noted earlier, the non-insulating material of the projected memory device 1 preferably has an electrical resistance that is tuned so as to be more permissive to read currents. That is, currents resulting from applied signals flow through the non-insulating material in a proportion that is substantially larger for currents arising from read signals S84 than for currents arising from write signals S83.

As seen in FIG. 8, the application S83 of a write signal is typically preceded by the application S81 of an amorphization (RESET) signal, which causes to amorphize, at least partly, the resistive memory material 11, 12. After a reset, a write signal is applied S83, e.g., to reach one of several possible resistance state. As noted earlier, one or more further write signals may possibly be applied after an initial write signal, so as to incrementally switch states, without necessarily having to go through an intermediate, amorphization step S81, the material 11, 12 permitting.

And as seen earlier, the signals applied may possibly be current signals or voltage signals. When the write signals and the read signals applied are (constant) voltage signal, then the amplitude of the write signals applied is normally substantially larger than the amplitude of the read signals.

Figure 9:
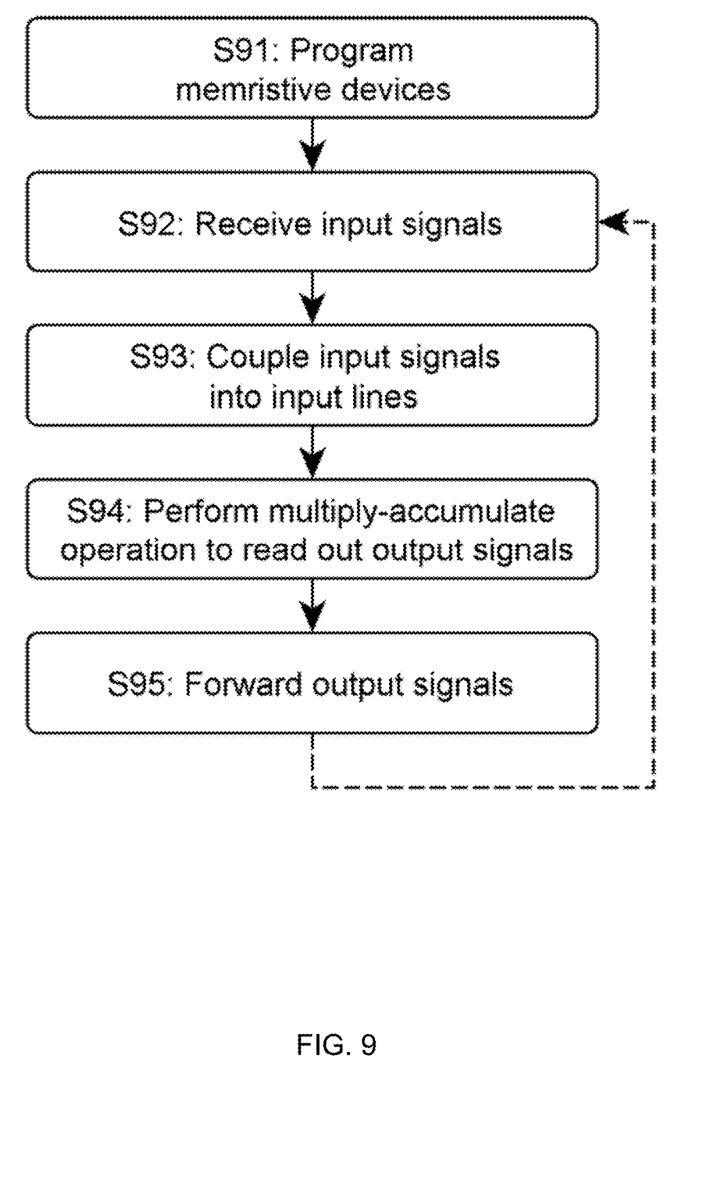
FIG. 9 is a flowchart illustrating high-level steps of a method of operating a memristive crossbar array such as shown in FIG. 4.

FIG. 9 shows a typical sequence of steps performed to operate a crossbar array structure 100 such as shown in FIG.

4 for inference purposes, where this array is used as a neuromorphic computing device, i.e., as an analog core computing device. One core equates a single layer of an ANN at a time. I.e., the core computing device is used to perform operations pertaining to a single ANN layer. Basically, such steps amount to programming the projected memory devices so as for them to store synaptic weights, prior to coupling input signals into input lines and reading out output signals obtained from the output lines according to a multiply-accumulate operation. In detail, memristive devices 1 of the neuromorphic device are first programmed S91. The programming is done at initialization, based on offline-trained weights values. Then, input signals received S92 from a lower ANN layer (except for the input layer) are coupled S93 into input lines of the core device, via input circuits 135. Next, a multiply-accumulate operation is performed at step S94, to obtain output values, which are then forwarded S95 to, e.g., a core-to-core communication infrastructure. The latter may further process such signals and pass them to a next core (as denoted by the dashed-line arrow), and so on, until a final output is obtained.

Next, according to a final aspect, the exemplary embodiments may be embodied as a method of fabricating a projected memory device. This method, illustrated in FIG. 10, aims at fabricating S101-S103 a projected memory device 1 such as described herein, i.e., including a memory segment 10 with a resistive memory material 11, 12, and a projection component 20 that extends parallel to and in contact with the memory segment 10, wherein the projection component includes a non-insulating material that essentially comprises carbon, e.g., amorphous carbon. The fabrication notably comprises tuning the electrical resistivity of the non-insulating material, which is carried out in accordance with a resistivity of the resistive memory material 11, 12.

Figure 10:
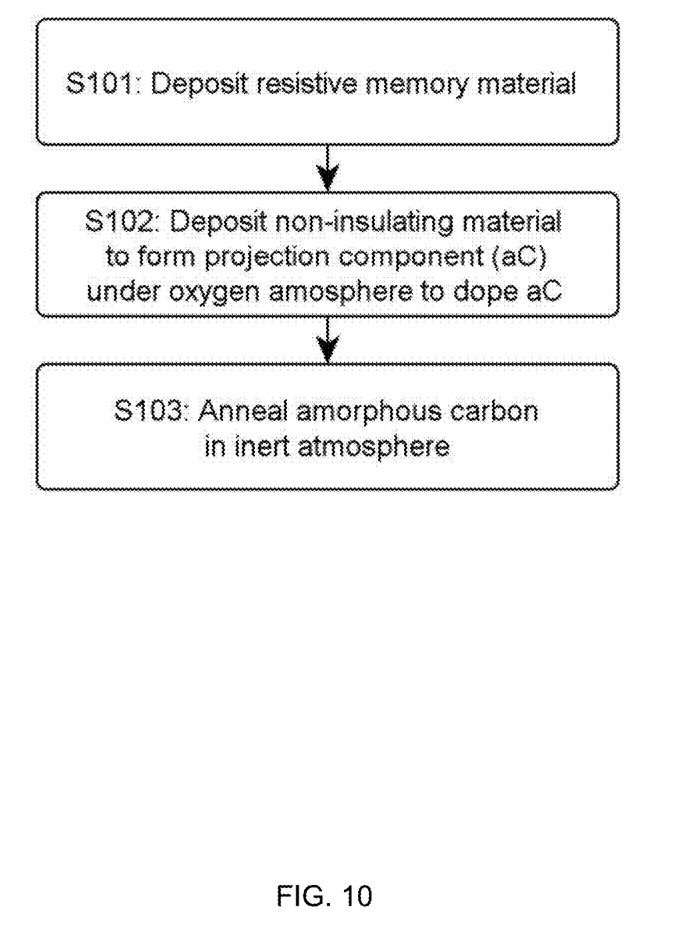
FIG. 10 is a flowchart showing high-level steps of a preferred method of fabrication of a projected memory device, according to embodiments.

As seen in FIG. 10, the fabrication of the projected memory device 1 may first comprise depositing S101 the resistive memory material 11, 12, to form the memory segment. The resistive memory material is deposited on an appropriate substrate, see, e.g., FIG. 5B. The non-insulating material is then deposited at step S102. Note, steps S101 and S102 may possibly be reversed. I.e., the aC layer may be deposited prior to depositing the resistive memory material, as in embodiments discussed below.

In both cases, the deposition step S102 may be performed in view of achieving a given resistivity. Various thin film deposition schemes may be contemplated. For example, step S102 may notably be performed using a physical vapor deposition technique (e.g., pulsed laser deposition, or magnetron sputtering, especially for the preparation of metal oxides, or DC/RF sputtering), a chemical vapor deposition technique, or a chemical growth technique. As said, the material may be deposited before or after the resistive memory material. E.g., the non-insulating material may be chemically or electrochemically grown on a substrate in situ or ex-situ, prior to or after the deposition of the resistive memory material.

The resistivity of the non-insulating material may notably be tuned by modulating, or somehow adapting the thickness of the non-insulating material while depositing it. The modulation axes may notably pertain to the deposition time, the working distance, the working pressure, and power modulation, for example.

In embodiments, the resistivity of the non-insulating material is further tuned by doping S102 the amorphous carbon with, e.g., oxygen, hydrogen, silicon, and/or nitrogen. Note, the amorphous carbon is preferably doped while depositing S102 the non-insulating material, by depositing the latter in an oxygen, hydrogen, or nitrogen atmosphere. Such a step if preferably performed in-situ, from reactive deposition processes in oxygen, hydrogen, or nitrogen atmosphere.

In embodiments, the resistivity of the non-insulating material is further tuned by annealing S103 the amorphous carbon in an inert atmosphere, e.g., after having deposited S102 the non-insulating material. In variants, the thermal treatment is performed during the deposition of the amorphous carbon. In other variants, the resistivity of the non-insulating material is further tuned through back sputtering in an inert atmosphere, after deposition of the non-insulating material. In further variants, step S101 is performed after step S102. Depositing first the amorphous carbon layer first allows more flexibility in the subsequent annealing step S103, which may be optimized for amorphous carbon only. Additional variants may be contemplated.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above may be contemplated. For example, other materials than those explicitly mentioned may possibly be contemplated by the skilled person.

The invention claimed is:

1. A projected memory device, comprising:
   two electrodes;
   a memory segment comprising a resistive memory material; and
   a projection component extending parallel to and in contact with the memory segment, the projection component including a non-insulating material that essentially comprises carbon,
   wherein the memory segment and the projection component connect the two electrodes, and
   wherein the projected memory device is fabricated by tuning a resistivity of the non-insulating material in accordance with a resistivity of the resistive memory material.

2. The projected memory device according to claim 1, wherein:
   the projected memory device is configured for information to be written in and read from the resistive memory material upon applying a write signal and a read signal, respectively, through the memory segment via the two electrodes, the resistive memory material partly undergoing a phase transition upon applying said write signal, and the non-insulating material has an electrical resistance tuned for a current resulting from an applied signal to flow through the non-insulating material in a proportion that is substantially larger for a current resulting from the read signal applied after said phase transition than for a current resulting from the write signal, in operation.

3. The projected memory device according to claim 2, wherein:
the resistive memory material is configured for said phase transition to lead to increase a crystalline fraction of the resistive memory material with respect to an amorphous fraction thereof upon applying said write signal, whereby a residual portion of the resistive memory material remains amorphous, in operation, and
the electrical resistance of the non-insulating material is configured for the non-insulating material to provide a current path of lower electrical resistance than said residual portion of the resistive memory material for the current resulting from the read signal applied, said current path having a length dependent on a size of said residual portion, in operation.

4. The projected memory device according to claim 3, wherein:
the resistive memory material is further configured for the projected memory device to have a plurality of programmable resistance states by applying respective write signals, and
the electrical resistance of the non-insulating material is tuned for a current path provided by the non-insulating material to have a lower electrical resistance than any residual, amorphous portion of the resistive memory material as obtained in any of the plurality of programmable states, for the current produced by the read signal, in operation.

5. The projected memory device according to claim 1, wherein:
the non-insulating material essentially comprises amorphous carbon.

6. The projected memory device according to claim 5, wherein:
the non-insulating material is doped with one or more of the following elements: oxygen, hydrogen, and nitrogen.

7. The projected memory device according to claim 5, wherein:
the projection component is configured as a layer coating said resistive memory material.

8. The projected memory device according to claim 7, wherein:
an electrical sheet resistance of the layer of non-insulating material is between 0.01 and 40 Megaohms-per-square.

9. The projected memory device according to claim 7, wherein:
said layer of non-insulating material has an average thickness that is between 1 and 20 nm.

10. The projected memory device according to claim 1, wherein:
said resistive memory material is a phase change memory material comprising one of GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

11. The projected memory device according to claim 10, wherein:
the non-insulating material is configured as a layer that essentially comprises amorphous carbon and has an average thickness that is between 1 and 20 nm; and
said resistive memory material is configured as a layer that has an average thickness between 1 and 50 nm and is coated by the layer of non-insulating material.

12. The projected memory device according to claim 11, wherein the projected memory device further comprises:
a substrate;
a first SiO2 layer extending above the substrate;
said layer of non-insulating material, extending over the SiO2 layer;
said layer of resistive memory material, extending on the layer of non-insulating material; and
a second SiO2 layer extending above the layer of resistive memory material.

13. The projected memory device according to claim 12, wherein:
the projection component essentially comprises amorphous carbon.

14. A method of using a projected memory device, the method comprising:
connecting two electrodes of a projected memory device using a memory segment and a projection component, the memory segment comprising a resistive memory material, the projection component extending parallel to and in contact with the memory segment, the projection component including a non-insulating material that essentially comprises carbon; and
writing information to and reading information from the resistive memory material by applying a write signal and a read signal, respectively, through the memory segment via the two electrodes, whereby the resistive memory material locally undergoes a phase transition upon applying said write signal.

15. The method according to claim 14, wherein:
the non-insulating material of the projected memory device has an electrical resistance tuned for a current resulting from an applied signal to flow through the non-insulating material in a proportion that is substantially larger for the read signal applied than for the write signal applied.

16. The method according to claim 14, wherein:
each of the write signal and the read signal applied is a constant voltage signal, wherein an amplitude of the write signal applied is substantially larger than an amplitude of the read signal applied.

17. The method according to claim 14, wherein:
the write signal is applied to increase a long-range order of the resistive memory material.

18. The method according to claim 17, the method further comprises:
applying an amorphization signal prior to applying said writing signal, to at least partly amorphize the resistive memory material.

19. A method of fabricating a projected memory device, the method comprising:
fabricating a projected memory device with a memory segment comprising a resistive memory material and a projection component that extends parallel to and in contact with the memory segment, the projection component including a non-insulating material that essentially comprises carbon, wherein fabricating the projected memory device comprises tuning a resistivity of the non-insulating material in accordance with a resistivity of the resistive memory material.

20. The method according to claim 19, wherein:
the projected memory device is fabricated so as for the non-insulating material to essentially include amorphous carbon.

21. The method according to claim 20, wherein fabricating the projected memory device comprises:
depositing said resistive memory material and depositing the non-insulating material for the projected memory device to have a given resistivity, using one of a physical vapor deposition technique, a chemical vapor deposition technique, and a chemical growth technique.

22. The method according to claim 20, wherein:
tuning the resistivity of the non-insulating material further comprises annealing the amorphous carbon in an inert atmosphere, after having deposited the non-insulating material.

23. The method according to claim 20, wherein:
the resistivity of the non-insulating material is further tuned with a through back sputtering technique performed in an inert atmosphere, after having deposited the non-insulating material.

24. The method according to claim 19, wherein:
tuning the resistivity of the non-insulating material comprises doping the amorphous carbon with one or more of: oxygen, hydrogen, and nitrogen.

25. The method according to claim 24, wherein:
the amorphous carbon is doped while depositing the non-insulating material, by depositing the non-insulating material in an atmosphere comprising said one or more of oxygen, hydrogen, and nitrogen.

* * * * *